(12) United States Patent
Sheppard et al.

(10) Patent No.: US 7,906,799 B2
(45) Date of Patent: Mar. 15, 2011

(54) NITRIDE-BASED TRANSISTORS WITH A PROTECTIVE LAYER AND A LOW-DAMAGE RECESS

(75) Inventors: Scott T. Sheppard, Chapel Hill, NC (US); Richard Peter Smith, Carrboro, NC (US); Zoltan Ring, Durham, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 11/358,241

(22) Filed: Feb. 21, 2006

(65) Prior Publication Data

US 2006/0255366 A1  Nov. 16, 2006

Related U.S. Application Data

(62) Division of application No. 10/758,871, filed on Jan. 16, 2004, now Pat. No. 7,045,404.

(51) Int. Cl.
*H01L 29/778* (2006.01)
(52) U.S. Cl. .................. 257/194; 257/E29.246
(58) Field of Classification Search .......... 257/190, 257/194, E29.246, 20, 24, 191, 201
See application file for complete search history.

(56) References Cited

U.S. PATENT DOCUMENTS

| | | |
|---|---|---|
| 4,424,525 A | 1/1984 | Mimura |
| 4,471,366 A | 9/1984 | Delagebeaudeuf et al. |
| 4,727,403 A | 2/1988 | Hida et al. |
| 4,755,867 A | 7/1988 | Cheng |
| 4,788,156 A | 11/1988 | Stoneham et al. |
| 4,946,547 A | 8/1990 | Palmour et al. |
| 4,987,008 A | 1/1991 | Yamazaki et al. |
| 5,053,348 A | 10/1991 | Mishra et al. |
| 5,172,197 A | 12/1992 | Nguyen et al. |
| 5,192,987 A | 3/1993 | Khan et al. |
| 5,196,358 A | 3/1993 | Boos |
| 5,200,022 A | 4/1993 | Kong et al. |
| 5,210,051 A | 5/1993 | Carter, Jr. |
| 5,292,501 A | 3/1994 | Degenhardt et al. |
| 5,296,395 A | 3/1994 | Khan et al. |

(Continued)

FOREIGN PATENT DOCUMENTS

EP   0 334 006 A1   9/1989

(Continued)

OTHER PUBLICATIONS

Ambacher et al., "Two Dimensional Electron Gases Induced by Spontaneous and Piezoelectric Polarization Charges in N- and Ga-face AlGaN/GaN Heterostructures," *Journal of Applied Physics*. vol. 85, No. 8, pp. 3222-3233 (Mar. 1999).

(Continued)

*Primary Examiner* — Jerome Jackson, Jr.
(74) *Attorney, Agent, or Firm* — Myers Bigel Sibley & Sajovec

(57) ABSTRACT

Transistors are fabricated by forming a nitride-based semiconductor barrier layer on a nitride-based semiconductor channel layer and forming a protective layer on a gate region of the nitride-based semiconductor barrier layer. Patterned ohmic contact metal regions are formed on the barrier layer and annealed to provide first and second ohmic contacts. The annealing is carried out with the protective layer on the gate region. A gate contact is also formed on the gate region of the barrier layer. Transistors having protective layer in the gate region are also provided as are transistors having a barrier layer with a sheet resistance substantially the same as an as-grown sheet resistance of the barrier layer.

28 Claims, 6 Drawing Sheets

U.S. PATENT DOCUMENTS

| | | | |
|---|---|---|---|
| 5,298,445 A | 3/1994 | Asano | |
| 5,302,840 A | 4/1994 | Takikawa | |
| RE34,861 E | 2/1995 | Davis et al. | |
| 5,389,571 A | 2/1995 | Takeuchi et al. | |
| 5,393,993 A | 2/1995 | Edmond et al. | |
| 5,523,589 A | 6/1996 | Edmond et al. | |
| 5,534,462 A | 7/1996 | Fiordalice et al. | |
| 5,569,943 A * | 10/1996 | Koscica et al. | 257/192 |
| 5,592,501 A | 1/1997 | Edmond et al. | |
| 5,686,737 A | 11/1997 | Allen | |
| 5,700,714 A | 12/1997 | Ogihara et al. | |
| 5,701,019 A | 12/1997 | Matsumoto et al. | |
| 5,705,827 A | 1/1998 | Baba et al. | |
| 5,796,127 A | 8/1998 | Hayafuji et al. | |
| 5,804,482 A | 9/1998 | Konstantinov et al. | |
| 5,885,860 A | 3/1999 | Weitzel et al. | |
| 5,900,641 A | 5/1999 | Hara et al. | |
| 5,946,547 A | 8/1999 | Kim et al. | |
| 5,990,531 A | 11/1999 | Taskar et al. | |
| 6,025,613 A | 2/2000 | Bito et al. | |
| 6,028,328 A | 2/2000 | Riechert et al. | |
| 6,046,464 A | 4/2000 | Schetzina | |
| 6,064,082 A | 5/2000 | Kawai et al. | |
| 6,086,673 A | 7/2000 | Molnar | |
| 6,150,680 A | 11/2000 | Eastman et al. | |
| 6,156,644 A * | 12/2000 | Ko et al. | 438/639 |
| 6,177,685 B1 | 1/2001 | Teraguchi et al. | |
| 6,218,680 B1 | 4/2001 | Carter, Jr. et al. | |
| 6,242,327 B1 | 6/2001 | Yokoyama et al. | |
| 6,316,793 B1 | 11/2001 | Sheppard et al. | |
| 6,429,467 B1 | 8/2002 | Ando | |
| 6,429,468 B1 | 8/2002 | Hsu et al. | |
| 6,447,604 B1 | 9/2002 | Flynn et al. | |
| 6,448,648 B1 | 9/2002 | Boos | |
| 6,492,669 B2 | 12/2002 | Nakayama et al. | |
| 6,498,111 B1 | 12/2002 | Kapolnek et al. | |
| 6,515,316 B1 | 2/2003 | Wojtowicz et al. | |
| 6,548,333 B2 | 4/2003 | Smith | |
| 6,586,781 B2 | 7/2003 | Wu et al. | |
| 6,639,255 B2 | 10/2003 | Inoue et al. | |
| 6,852,615 B2 | 2/2005 | Micovic et al. | |
| 7,030,428 B2 * | 4/2006 | Saxler | 257/194 |
| 7,052,942 B1 | 5/2006 | Smart et al. | |
| 2001/0015446 A1 | 8/2001 | Inoue et al. | |
| 2001/0017370 A1 | 8/2001 | Sheppard et al. | |
| 2001/0020700 A1 | 9/2001 | Inoue et al. | |
| 2001/0023964 A1 | 9/2001 | Wu et al. | |
| 2001/0040246 A1 | 11/2001 | Ishii | |
| 2002/0008241 A1 | 1/2002 | Edmond et al. | |
| 2002/0017696 A1 | 2/2002 | Nakayama et al. | |
| 2002/0066908 A1 | 6/2002 | Smith | |
| 2002/0079508 A1 | 6/2002 | Yoshida | |
| 2002/0119610 A1 | 8/2002 | Nishii et al. | |
| 2002/0163012 A1 * | 11/2002 | Nihei et al. | 257/194 |
| 2002/0167023 A1 | 11/2002 | Chavarkar et al. | |
| 2003/0017683 A1 | 1/2003 | Emrick et al. | |
| 2003/0020092 A1 | 1/2003 | Parikh et al. | |
| 2003/0102482 A1 | 6/2003 | Saxler | |
| 2003/0123829 A1 | 7/2003 | Taylor | |
| 2003/0145784 A1 | 8/2003 | Thompson et al. | |
| 2003/0157776 A1 | 8/2003 | Smith | |
| 2003/0213975 A1 | 11/2003 | Hirose et al. | |
| 2004/0004223 A1 | 1/2004 | Nagahama et al. | |
| 2004/0021152 A1 | 2/2004 | Nguyen et al. | |
| 2004/0029330 A1 | 2/2004 | Hussain et al. | |
| 2004/0061129 A1 | 4/2004 | Saxler et al. | |
| 2004/0124435 A1 * | 7/2004 | D'Evelyn et al. | 257/103 |
| 2004/0144991 A1 | 7/2004 | Kikkawa | |
| 2004/0241970 A1 | 12/2004 | Ring | |
| 2005/0133816 A1 * | 6/2005 | Fan et al. | 257/190 |
| 2006/0043415 A1 * | 3/2006 | Okamoto et al. | 257/192 |
| 2006/0054925 A1 * | 3/2006 | Kikkawa | 257/192 |

FOREIGN PATENT DOCUMENTS

| | | |
|---|---|---|
| EP | 0 563 847 A2 | 10/1993 |
| JP | 10-050982 | 2/1998 |
| JP | 11261053 | 9/1999 |
| JP | 2001230407 A | 8/2001 |
| JP | 2002016087 A | 1/2002 |
| JP | 2004-342810 | 12/2004 |
| WO | WO 93/23877 A1 | 11/1993 |
| WO | WO 01/57929 A1 | 8/2001 |
| WO | WO 03/049193 A1 | 6/2003 |
| WO | WO 2004/008495 | 1/2004 |

OTHER PUBLICATIONS

Ando et al., "10-W/mm AlGaN-GaN HFET With a Field Modulating Plate," *IEEE Electron Device Letters*, 24(5), pp. 289-291 (May 2003).

Asbeck et al. "Piezoelectric charge densities in AlGaN/GaN HFETs," *Elecronics Letters*. vol. 33, No. 14, pp. 1230-1231 (1997).

Beaumont, B. et al., "Epitaxial Lateral Overgrowth of GaN," *Phys. Stat. Sol.* (b) 227, No. 1, pp. 1-43 (2001).

Ben-Yaacov et al., "AlGaN/GaN Current Aperture Vertical Electron Transistors with Regrown Channels," *Journal of Applied Physics*. vol. 95, No. 4, pp. 2073-2078 (2004).

Breitschadel et al. "Minimization of Leakage Current of Recessed Gate AlGaN/GaN HEMTs by Optimizing the Dry-Etching Process." *Journal of Electronic Materials*. vol. 28, No. 12, pp. 1420-1423 (1999).

Burm et al. "Recessed Gate GaN MODFETS," *Solid-State Electronics*. vol. 41. No. 2, pp. 247-250 (1997).

Burm et al. "Ultra-Low Resistive Ohmic Contacts on n-GaN Using Si Implantation," *Applied Physics Letters*. vol. 70, No. 4, 464-66 (1997).

Chang et al., "AlGaN/GaN Modulation-Doped Field-Effect Transistors with an Mg-doped Carrier Confinement Layer," *Jpn. J. Appl. Phys.*, 42:3316-3319 (2003).

Chen et al. "Cl2 reactive ion etching for gate recessing of AlGaN/GaN field-effect transistors," *J. Vac. Sci. Technol. B*. vol. 17, No. 6, pp. 2755-2758 (1999).

Chini et al., "Power and Linearity Characteristics of Field-Plagted Recessed-Gate AlGaN-GaN HEMTs," *IEEE Electron Device Letters*, 25(5), pp. 229-231 (May 2004).

Cho et al., "A New GaAs Field Effect Transistor (FET) with Dipole Barrier (DIB)," *Jpn. J. Appl. Phys*. 33:775-778 (1994).

Coffie et al., Unpassivated p-GaN/AlGaN/GaN HEMTs with 7.1 W/MMF at 10 GHz, *Electronic Letters online* No. 20030872, 39(19), (Sep. 18, 2003).

Eastman et al. "GaN materials for high power microwave amplifiers," *Mat. Res. Soc. Symp. Proc.* vol. 512 (1998).

Eastman et al. "Undoped AlGaN/GaN HEMTs for Microwave Power Amplification," *IEEE Transactions on Electron Devices*. vol. 48, No. 3, pp. 479-85 (Mar. 2001).

Egawa et al. "Recessed gate ALGaN/GaN MODFET on Sapphire Grown by MOCVD," *Applied Physics Letters*. vol. 76, No. 1, pp. 121-123 (Jan. 2000).

Gaska et al. "High-Temperature Performance of AlGaN/GaN HFETs on SiC Substrates," *IEEE Electron Device Letters*. vol. 18, No. 1, pp. 492-494 (Oct. 1997).

Gaska et al. "Electron Transport in AlGaN/GaN Heterostructures Grown on 6H-SiC Substrates," *Applied Physics Letters*. vol. 72, No. 6, pp. 707-709 (Feb. 1998).

Gaska et al., "Self-Heating in High-Power AlGaN/GaN HFETs," *IEEE Electron Device Letters*, 19(3), pp. 89-91 (Mar. 1998).

Gelmont et al. "Monte Carlo simulation of electron transport in gallium nitride," *Journal of Applied Physics*. vol. 74, No. 3, pp. 1818-1821 (Aug. 1993).

Heikman et al. "Polarization Effects in AlGaN/GaN and GaN/AlGaN/GaN heterostructures," *Journal of Applied Physics*. vol. 93, No. 12, pp. 10114-10118 (Jun. 2003).

Heikman et al., "Growth of Fe-Doped Semi-insulating GaN by Metalorganic Chemical Vapor Deposition," *Applied Physics Letters*. vol. 83, No. 1, pp. 439-441 (Jul. 2002).

Heikman, et al., "Mass Transport Regrowth of GaN for Ohmic Contacts to AlGaN/GaN," *Applied Physics Letters*. vol. 78, No. 19, pp. 2876.

Heikman, Sten J., *MOCVD Growth Technologies for Applications in AlGaN/GaN High Electron Mobility Transistors*, Dissertation, University of California—Santa Barbara, Sep. 2002, 190 pages.

Hikita et al., "350V/150A AlGaN/GaN Power HFET on Silicon

Substrate With Source-via Grouding (SVG) Structure," *Electron Devices Meeting*, 2004, pp. 803-806, IEDM Technical Digest. IEEE International (Dec. 2004).

Kanaev et al., "Femtosecond and Ultraviolet Laser Irradiation of Graphitelike Hexagonal Boron Nitride," *Journal of Applied Physics*, 96(8), pp. 4483-4489 (Oct. 15, 2004).

Kanamura et al., "A 100-W High-Gain AlGaN/GaN HEMT Power Amplifier on a Conductive N-SiC Substrate for Wireless Base Station Applications," *Electron Devices Meeting*, 2004, pp. 799-802, IEDM Technical Digest. IEEE International (Dec. 2004).

Karmalkar et al. "Enhancement of Breakdown Voltage in AlGaN/GaN High Electron Mobility Transistors Using a Field Plate," *IEEE Transactions on Electron Devices*. vol. 48, No. 8, pp. 1515-1521 (Aug. 2001).

Karmalkar et al. "RESURF AlGaN/GaN HEMT for High Voltage Power Switching," *IEEE Electron Device Letters*. vol. 22, No. 8, pp. 373-375 (Aug. 2001).

Karmalkar et al., "Very High Voltage AlGaN/GaN High Electron Mobility Transistors Using a Field Plate Deposited on a Stepped Insulator," *Solid State Electronics*, vol. 45, pp. 1645-1652 (2001).

Kashahara et al., "Ka-ban 2.3W Power AlGaN/GaN Heterojunction FET," *IEDM Technical Digest*, pp. 677-680 (2002).

Komiak et al., "Fully Monolithic 4 Watt High Efficiency Ka-band Power Amplifier," *IEEE MTT-S International Microwave Symposium Digest*, vol. 3, pp. 947-950 (1999).

Küsters et al., "Double-Heterojunction Lattice-Matched and Pseudomorphic InGaAs HEMT with δ-Doped InP Supply Layers and p-InP Barrier Enhancement Layer Grown by LP-MOVPE," *IEEE Electron Device Letters*, 14(1), (Jan. 1993).

Kuzmik et al. "Annealing of Schottky contacts deposited on dry etched AlGaN/Gan," *Semiconductor Science and Technology*. vol. 17, No. 11 (Nov. 2002).

Manfra et al., "Electron Mobility Exceeding 160 000 $cm^2/V$ s in AlGaN/GaN Heterostructures Grown by Molecular-beam Epitaxy," *Applied Physics Letters*, 85(22), pp. 5394-5396 (Nov. 29, 2004).

Manfra et al., "High Mobility AlGaN/GaN Heterostructures Grown by Plasma-assisted Molecular beam epitaxy on Semi-Insulating GaN Templates Prepared by Hydride Vapor Phase Epitaxy," *Journal of Applied Physics*, 92(1), pp. 338-345 (Jul. 1, 2002).

Manfra et al., "High-Mobility AlGaN/GaN Heterostructures Grown by Molecular-beam Epitaxy on GaN Templates Prepared by Hydride Vapor Phase Epitaxy," *Applied Physics Letters*, 77(18), pp. 2888-2890 (Oct. 30, 2000).

Neuburger et al. "Design of GaN-based Field Effect Transistor Structures based on Doping Screening of Polarization Fields," WA 1.5, 7th Wide-Gandgap III-Nitride Workshop (Mar. 2002).

Parikh et al., "Development of Gallium Nitride Epitaxy and Associated Material-Device Correlation for RF, Microwave and MM-wave Applications," Cree, Inc. (35 slides).

Ping et al. "DC and Microwave Performance of High-Current AlGaN/GaN Heterostructure Field Effect Transistors Grown on p-Type SiC Substrates," *IEEE Electron Device Letters*. vol. 19, No. 2, pp. 54-56 (Feb. 1998).

Saxler et al., "III-Nitride Heterostructures on High-Purity Semi-Insulating 4H-SiC Substrates for High-Power RF Transistors," International Workshop on Nitride Semiconductors (Jul. 19, 2004).

Shen et al., "High-Power Polarization-Engineered GaN/AlGaN/GaN HEMTs Without Surface Passivation," *IEEE Electronics Device Letters*. vol. 25, No. 1, pp. 7-9 (2004).

Sheppard et al. "High Power Demonstration at 10 GHz with GaN/AlGaN HEMT Hybrid Amplifiers." Presented at the 58th DRC, Denver, CO, Jun. 2000.

Sheppard et al. "Improved 10-GHz Operation of GaN/AlGaN HEMTs on Silicon Carbide," *Materials Science Forum*. vols. 338-342, pp. 1643-1646, (2000).

Shiojima et al., "Improved Carrier Confinement by a Buried p-Layer in the AlGaN/GaN HEMT Structure," *IEICE Trans. Electron.*, E83-C(12), (Dec. 2000).

Sriram et al. "RF Performance of AlGaN/GaN MODFET's on High Resistivity SiC Substrates," Presentation at Materials Research Society Fall Symposium, 1997.

Sriram et al. "SiC and GaN Wide Bandgap Microwave Power Transistors," *IEEE Samoff Symposium*, Pittsburgh, PA, Mar. 18, 1998.

Sullivan et al. "High-Power 10-GHz Operation of AlGaN HFETs on Insulating SiC," *IEEE Electron Device Letters*. vol. 19, No. 6, pp. 198-200 (Jun. 1998).

"Thick AlN template on SiC substrate—Novel semi insulating substrate for GaN-based devices," © 2003 by TDI, Inc., http://www.tdii.com/products/AlN_SiCT.html.

Tilak et al., "Influence of Barrier Thickness on the High-Power Performance of AlGaN/GaN HEMTs," *IEEE Electron Device Letters*, 22(11), pp. 504-506 (Nov. 2001).

United States Patent Application entitled "Nitride-Based Transistors and Methods of Fabrication Thereof Using Non-Etched Contact Recesses," U.S. Appl. No. 10/617,843, filed Jul. 11, 2003.

United States Patent Application entitled "Improved Dielectric Passivation for Semiconductor Devices," U.S. Appl. No. 10/851,507, filed May 22, 2004.

United States Patent Application entitled "Methods of Having Laterally Grown Active Region and Methods of Fabricating Same," filed Jul. 26, 2004.

United States Patent Application entitled "Silicon Carbide on Diamond Substrates and Related Devices and Methods," U.S. Appl. No. 10/707,898, filed Jan. 22, 2004.

United States Patent Application entitled "Methods of Fabricating Nitride-Based Transistors with a Cap Layer and a Recessed Gate," U.S. Appl. No. 10/897,726, filed Jul. 23, 2004.

United States Patent Application entitled "Semiconductor Devices Having a Hybrid Channel Layer, Current Aperture Transistors and Methods of Fabricating the Same," U.S. Appl. No. 10/849,589, filed May 20, 2004.

United States Patent Application entitled "Methods of Fabricating Nitride-Based Transistors Having Regrown Ohmic Contact Regions and Nitride-Based Transistors Having Regrown Ohmic Contact Regions," U.S. Appl. No. 10/849,617, filed May 20, 2004.

United States Patent Application entitled "High Power Density and/or Linearity Transistors," U.S. Appl. No. 11/005,107, filed Dec. 6, 2004.

United States Patent Application entitled "Field Effect Transistors (FETS) Having Multi-Watt Output Power at Millimeter-Wave Frequencies," U.S. Appl. No. 11/005,423, filed Dec. 6, 2004.

United States Patent Application entitled "Group III Nitride Field Effect Transistors (FETs) Capable of Withstanding High Temperature Reverse Bias Test Conditions," U.S. Appl. No. 11/080,905, filed Mar. 15, 2005.

United States Patent Application entitled "Aluminum Free Group III-Nitride Based High Electron Mobility Transistors and Methods of Fabricating Same," U.S. Appl. No. 11/118,575, filed Apr. 29, 2005.

United States Patent Application entitled "Binary Group III-Nitride Based High Electron Mobility Transistors and Methods of Fabricating Same," U.S. Appl. No. 11/118,675, filed Apr. 29, 2005.

United States Patent Application entitled "Composite Substrates of Conductive and Insulating or Semi-Insulating Group III-Nitrides For Group III-Nitride Devices," U.S. Appl. No. 11/103,127, filed Apr. 11, 2005.

United States Patent Application entitled "Thick Semi-Insulating or Insulating Epitaxial Gallium Nitride Layers and Devices Incorporating Same," U.S. Appl. No. 11/103,117, filed Apr. 11, 2005.

United States Patent Application entitled "Cap Layers and/or Passivation Layers for Nitride-Based Transistors, Transistor Structures and Methods of Fabricating Same," U.S. Appl. No. 10/996,249, filed Nov. 23, 2004.

Walker, J. L. B. (Ed.), *High Power GaAs FET Amplifiers*, Norwood, MA: Artech House, pp. 119-120 (1993).

Wu et al., "3.5-Watt AlGaN/GaN HEMTs and Amplifiers at 35 GHz," IEDM-2003, Cree, Inc.

Wu et al., "3.5-Watt AlGaN/GaN HEMTs and Amplifiers at 35 GHz," Cree Santa Barbara Technology Center, Goleta, CA 93117.

Wu et al., "30-W/mm GaN HEMTs by Field Plate Optimization," *IEEE Electron Device Letters*, 25(3), pp. 117-119 (Mar. 2004).

Wu et al., "Bias-dependent Performance of High-Power AlGaN/GaN HEMTs," *IEDM Technical Digest*, p. 378-380 (2001).

Wu et al., "Linearity Performance of GaN HEMTs With Field Plates," DRC 2004, Cree, Inc.

Wu et al., "Linearity Performance of GaN HEMTs With Field Plates," Cree Santa Barbara Technology Center, Goleta, CA 93117.

Yu et al., "Schottky Barrier Engineering in III-V Nitrides via the Piezoelectric Effect," *Applied Physics Letters*, 73(13), pp. 1880-1882 (Sep. 28, 1998).

Zhang et al., "High Breakdown GaN HEMT with Overlapping Gate Structure," *IEEE Electron Device Letters*, 21(9), pp. 421-423 (Sep. 2000).

Wu et al. "30-W/mm GaN HEMTs by Field Plate Optimization," *IEEE Electron Device Letters*. vol. 25, No. 3, pp. 117-119 (Mar. 2004).

Wu et al. "High Al-Content AlGaN/GaN MODFETs for Ultrahigh Performance," *IEEE Electron Device Letters*. vol. 19, No. 2, pp. 50-53 (Feb. 1998).

Yu et al. "Schottky barrier engineering in III-V nitrides via the piezoelectric effect," *Applied Physics Letters*. vol. 73, No. 13, pp. 1880-1882, (Sep. 1998).

United States Patent Application entitled "Co-Doping for Fermi Level Control in Semi-Insulating Group III Nitrides," filed Jan. 7, 2004.

United States Patent Application entitled "Nitride Heterojunction Transistors Having Charge-Transfer Induced Energy Barriers and Methods of Fabricating the Same," filed Feb. 5, 2004.

Masaki et al., "Structural and Electrical Properties of $SiN_x$:H Films," *J. Appl. Phys.* vol. 73 (10), May 15, 1993, pp. 5088-5094.

Martil et al., "Rapid Thermally Annealed Plasma Deposited $SiN_x$:H Thin Films: Application to Metal-Insulator-Semiconductor Structures with Si, $In_{0.53}Ga_{0.47}As$, and InP," *J. Appl. Phys*, vol. 94, (4), Aug. 15, 2003, pp. 2642-2653.

Derluyn et al., "Improvement of AlGaN/GaN High Electron Mobility Transistor Structures by in situ deposition of $Si_3N_4$ Surface Layer," *J. Appl. Phys.*, vol. 98, 054501, Sep. 2, 2005.

Kotecki et al., "Hydrogen Incorporation in Silicon Nitride Films Deposited by Remote Electron-Cyclotron-Resonance Chemical Vapor Deposition," *J. Appl. Phys.*, vol. 77 (3), Feb. 1, 1995, pp. 1284-1293.

Park, et al., "Deposited Silicon Nitride with Low Electron Trapping Rates," *J. Appl. Phys.*, vol. 74 (1), Jul. 1, 1993, pp. 381-386.

Wang, et al. "Comparison of the Effect of Gate Dielectric Layer on 2DEG Carrier Concentration in Strained AlGaN/GaN Heterostructure," *Mater Res. Soc. Symp. Proc.*, vol. 831, 2005.

Leys, et al. "Surface Stabilization for Higher Performance ALGaN/GaN HEMT with in-situ MOVPE SIN," *Mater Res. Soc. Symp. Proc.*, vol. 831, 2005.

Wetzel, et al. "GaN, AlN, InN, and Their Alloys," Symposium E, held Nov. 29-Dec. 3, 2004, to be published in vol. 831, Mat. Res. Soc. Symp. Proc. (Publication date of Abstracts unkown).

United States Patent Application entitled "Passivation of Wide Band-Gap Based Semiconductor Devices with Hydrogen-Free Sputtered Nitrides," U.S. Appl. No. 11/169,378, filed Jun. 29, 2005 with USPTO.

Gotz et al., "Hydrogen Passivation of Mg Acceptors in GaN Grown by Metalorganic Cheical Vapor Deposition," Appl. Phys. Lett. 67 (18), Oct. 30, 1995.

Neugebauer, et al., "Role of Hydrogen in Doping of GaN," Appl. Phys. Lett. 68 (13) Mar. 25, 1996.

K. Zimmer, "Etching of fused silica and glass with excimer laser at 351 nm", Applied Surface Science 208-209 (2003) pp. 199-204.

\* cited by examiner

NITRIDE-BASED TRANSISTORS WITH A PROTECTIVE LAYER AND A LOW-DAMAGE RECESS

CLAIM OF PRIORITY

The present application is a divisional of and claims priority from U.S. application Ser. No. 10/758,871, filed Jan. 16, 2004 now U.S. Pat. No. 7,045,404, entitled "NITRIDE-BASED TRANSISTORS WITH A PROTECTIVE LAYER AND A LOW-DAMAGE RECESS AND METHODS OF FABRICATION THEREOF," which is assigned to the assignee of the present application, the disclosure of which is hereby incorporated herein by reference as if set forth fully.

STATEMENT OF GOVERNMENT INTEREST

This invention was made with Government support. The Government has certain rights in this invention.

FIELD OF THE INVENTION

The present invention relates to semiconductor devices and, more particularly, to transistors that incorporate nitride-based active layers.

BACKGROUND

Materials such as silicon (Si) and gallium arsenide (GaAs) have found wide application in semiconductor devices for lower power and (in the case of Si) lower frequency applications. These, more familiar, semiconductor materials may not be well suited for higher power and/or high frequency applications, however, because of their relatively small bandgaps (e.g., 1.12 eV for Si and 1.42 for GaAs at room temperature) and/or relatively small breakdown voltages.

In light of the difficulties presented by Si and GaAs, interest in high power, high temperature and/or high frequency applications and devices has turned to wide bandgap semiconductor materials such as silicon carbide (2.996 eV for alpha SiC at room temperature) and the Group III nitrides (e.g., 3.36 eV for GaN at room temperature). These materials, typically, have higher electric field breakdown strengths and higher electron saturation velocities as compared to gallium arsenide and silicon.

A device of particular interest for high power and/or high frequency applications is the High Electron Mobility Transistor (HEMT), which is also known as a modulation doped field effect transistor (MODFET). These devices may offer operational advantages under a number of circumstances because a two-dimensional electron gas (2DEG) is formed at the heterojunction of two semiconductor materials with different bandgap energies, and where the smaller bandgap material has a higher electron affinity. The 2DEG is an accumulation layer in the undoped ("unintentionally doped"), smaller bandgap material and can contain a very high sheet electron concentration in excess of, for example, $10^{13}$ carriers/cm$^2$. Additionally, electrons that originate in the wider-bandgap semiconductor transfer to the 2DEG, allowing a high electron mobility due to reduced ionized impurity scattering.

This combination of high carrier concentration and high carrier mobility can give the HEMT a very large transconductance and may provide a strong performance advantage over metal-semiconductor field effect transistors (MESFETs) for high-frequency applications.

High electron mobility transistors fabricated in the gallium nitride/aluminum gallium nitride (GaN/AlGaN) material system have the potential to generate large amounts of RF power because of the combination of material characteristics that includes the aforementioned high breakdown fields, their wide bandgaps, large conduction band offset, and/or high saturated electron drift velocity. A major portion of the electrons in the 2DEG is attributed to polarization in the AlGaN. HEMTs in the GaN/AlGaN system have already been demonstrated. U.S. Pat. Nos. 5,192,987 and 5,296,395 describe AlGaN/GaN HEMT structures and methods of manufacture. U.S. Pat. No. 6,316,793, to Sheppard et al., which is commonly assigned and is incorporated herein by reference, describes a HEMT device having a semi-insulating silicon carbide substrate, an aluminum nitride buffer layer on the substrate, an insulating gallium nitride layer on the buffer layer, an aluminum gallium nitride barrier layer on the gallium nitride layer, and a passivation layer on the aluminum gallium nitride active structure.

One step in the fabrication of nitride-based transistors is the formation of ohmic contacts for such transistors. The formation of ohmic contacts has, typically, required high annealing temperatures (e.g. 900° C.). Such high annealing temperatures may damage the materials and/or the device.

For example, in conventional devices utilizing high annealing temperatures when forming ohmic contacts, the sheet resistance of a gate region (defined as the active device region between the two contacts) of AlGaN and/or GaN layers typically increases in comparison to sheet resistances of the AlGaN and/or GaN layers as-grown. Such an increase in sheet resistance is believed to detrimentally affect the device.

SUMMARY OF THE INVENTION

Embodiments of the present invention provide for fabricating a transistor by forming a nitride-based semiconductor barrier layer on a nitride-based semiconductor channel layer and forming a protective layer on a gate region of the nitride-based semiconductor barrier layer. Patterned ohmic contact metal regions are formed on the barrier layer and annealed to provide first and second ohmic contacts. The annealing is carried out with the protective layer on the gate region. A gate contact is also formed on the gate region (e.g., the active device region between the first and second ohmic contacts) of the barrier layer.

In further embodiments of the present invention, the protective layer is removed subsequent to annealing the patterned ohmic contact metal. The protective layer may be an aluminum nitride layer. The protective layer may be removed utilizing a low damage etching technique. For example, the low damage etching technique may include wet removal with a strong base, such as KOH. After removing the protective layer a passivation layer may be formed on exposed portions of the barrier layer. In these embodiments, the gate contact may be formed by etching a recess in the passivation layer utilizing a low damage etch technique to expose a portion of the gate region of the barrier layer and forming the gate contact in the recess in the passivation layer.

In additional embodiments of the present invention, the passivation layer is formed on exposed portions of the barrier layer and the protective layer. In these embodiments, the gate contact may be provided by forming a gate contact that extends through the passivation layer and the protective layer to contact the barrier layer.

In yet other embodiments of the present invention, forming a protective layer includes forming a patterned protective layer on the barrier layer. The patterned protective layer covers a first portion of the barrier layer corresponding to the gate region and exposes adjacent second portions of the barrier layer corresponding to the first and second ohmic contacts. The patterned ohmic contact metal regions are provided by forming patterned ohmic contact metal regions on the second portions of the barrier layer. The patterned ohmic contact metal regions are adjacent and spaced apart from the patterned protective layer.

In still further embodiments of the present invention, forming the patterned protective layer includes blanket depositing a protective layer material on the barrier layer, forming a mask, typically photoresist, on the blanket deposited protective layer material, the mask having windows corresponding to locations of the first and second ohmic contacts, etching the blanket-deposited protective layer through the windows utilizing a low damage etching technique and removing the mask. The windows corresponding to locations of the first and second ohmic contacts may be larger than an area of the first and second ohmic contacts. The low damage etching technique may be one or more of RIE, ECR, downstream plasma and/or ICP using $CF_4/O_2$, $NF_3/O_2$ and/or other fluorinated species.

Forming the gate contact may include etching a recess in the patterned protective layer that exposes a portion of the first portion of the barrier layer and depositing a gate contact in the recess. Forming a recess may include forming a mask on the patterned protective layer, the mask having a window corresponding to location of the recess, etching the patterned protective layer through the window utilizing a low damage etching technique and removing the mask. The low damage etching technique utilized to etch the patterned protective layer may include RIE, ECR, downstream plasma and/or ICP using $CF_4/O_2$, $NF_3/O_2$ and/or other fluorinated species.

In particular embodiments of the present invention, the protective layer includes SiN, AlN and/or $SiO_2$. The SiN, AlN and/or $SiO_2$ may be non-stoichiometric and can have compressive or tensile strain. The protective layer may be deposited using physical vapor deposition (PVD) and/or chemical vapor deposition (CVD).

In yet additional embodiments of the present invention, a passivation layer is formed on the patterned protective layer so as to substantially fill gaps between the patterned protective layer and the first and second ohmic contacts. The patterned protective layer and the passivation layer may be the same or different materials. For example, the patterned protective layer may be aluminum nitride and the passivation layer may be silicon nitride. Alternatively, the patterned protective layer and the passivation layer may be silicon nitride.

In still other embodiments of the present invention, the patterned protective layer is removed so as to expose the first portion of the barrier layer. Removing the patterned protective layer may be followed by forming a passivation layer on exposed portions of the barrier layer. In such embodiments, the patterned protective layer may be aluminum nitride and the passivation layer may be silicon nitride.

In further embodiments of the present invention, formation of the gate contact is preceded by forming the passivation layer. The gate contact is provided by forming a recess in the passivation layer that exposes a portion of the first portion of the barrier layer and forming a gate contact in the recess. Forming the recess may include forming a mask on the passivation layer. The mask has a window corresponding to location of the recess. The passivation layer is etched through the window utilizing a low damage etching technique and the mask is then removed.

In particular embodiments of the present invention, the nitride-based channel layer and the nitride-based semiconductor barrier layer are Group III-nitride layers. For example, the channel layer may have a composition of $Al_xGa_{1-x}N$ wherein $0 \leq x < 1$, where the bandgap of the channel layer is less than the bandgap of the barrier layer. The channel layer could also be aluminum gallium nitride (AlGaN), gallium nitride (GaN), indium gallium nitride (InGaN), and/or aluminum indium gallium nitride (AlInGaN) and the barrier layer could be aluminum nitride (AlN), aluminum indium nitride (AlInN), AlGaN, GaN, InGaN, and/or AlInGaN. The barrier layer and/or the channel layer may be multiple layers. A buffer layer may also be formed on a substrate and the channel layer formed on the buffer layer to provide the nitride-based channel layer. The channel layer and the barrier layer may be configured to provide a High Electron Mobility Transistor (HEMT). The nitride-based channel layer may be provided on a SiC substrate.

In still further embodiments of the present invention, the formation of the gate contact is preceded by the formation of a passivation layer. The formation of the gate contact the includes forming a recess in the passivation layer and the patterned protective layer that exposes a portion of the first portion of the barrier layer and forming a gate contact in the recess.

In particular embodiments of the present invention, the protective layer is formed to a thickness of at least about a thickness of the ohmic contact material. The protective layer may also have a thickness of at least about two monolayers. In particular, the protective layer may have a thickness of from about 1 nm to about 500 nm.

In yet other embodiments of the present invention, a high electron mobility transistor includes a nitride-based channel layer on a substrate and a nitride-based semiconductor barrier layer on the nitride-based channel layer. The channel of electrons at the interface between the channel and barrier layers has a sheet resistance that is substantially the same as an as-grown sheet resistance of the nitride-based HEMT channel. Ohmic contacts and a gate contact are provided on the barrier layer.

The high electron mobility transistor may further include a protective layer disposed on the barrier layer that is adjacent and spaced apart from the ohmic contacts and that the gate contact extends through. A passivation layer may also be provided on the protective layer and that substantially fills a gap between the ohmic contacts and the protective layer. The passivation layer may also be on the protective layer and the gate contact may extend through the protective layer and the passivation layer. The gate contact may be also be provided directly on the protective layer. The passivation layer on the barrier layer may substantially fill a gap between the ohmic contacts and the gate contact.

In particular embodiments of the present invention, the nitride-based channel layer and the nitride-based semiconductor barrier layer each include a Group III-nitride layer. The channel layer may have a lower bandgap than the barrier layer. The channel layer may include an undoped layer having a thickness of greater than about 20 Å. The channel layer may also include a superlattice and/or a combination of Group III-nitride layers. The channel layer may include aluminum gallium nitride (AlGaN), gallium nitride (GaN), indium gallium nitride (InGaN), and/or aluminum indium gallium nitride (AlInGaN). The barrier layer may include aluminum nitride (AlN), aluminum indium nitride (AlInN), AlGaN, GaN, InGaN, and/or AlInGaN. For example, the barrier layer may include $Al_xGa_{1-x}N$ wherein $0 < x < 1$. The barrier layer may include multiple layers. A buffer layer may also be provided on the substrate, where the nitride-based channel layer is disposed on the buffer layer.

In still further embodiments of the present invention, the protective layer has a thickness of at least about a thickness of the ohmic contacts. The ohmic contacts may also have a contact resistance of less than about 1 Ω-mm.

In yet other embodiments of the present invention, a high electron mobility transistor includes a nitride-based channel layer on a substrate, a nitride-based semiconductor barrier layer on the nitride-based channel layer, a protective layer on the barrier layer, ohmic contacts on the barrier layer, adjacent and spaced apart from the protective layer so as to provide a gap between the ohmic contacts and the protective layer and a gate contact on the barrier layer and extending through the protective layer. A passivation layer may also be provided on the protective layer and that substantially fills the gap between the ohmic contacts and the protective layer.

In still further embodiments of the present invention, fabrication of a transistor includes forming a nitride-based semiconductor barrier layer on a nitride-based semiconductor channel layer and forming a protective layer on a gate region of the nitride-based semiconductor barrier layer. Patterned ohmic contact metal regions are formed on the barrier layer. The patterned ohmic contact metal is annealed to provide first and second ohmic contacts, for example, source and drain contacts. A recess is etched in the protective layer in a gate region of the barrier layer utilizing a low damage etch technique to expose a portion of the gate region of the barrier layer. The gate contact is formed in the recess in the passivation layer.

In particular embodiments of the present invention, the protective layer comprises a passivation layer. The protective layer may, for example, be an aluminum nitride layer, a silicon nitride layer and/or a silicon dioxide layer or layers. The low damage etching technique may be a wet etch using a strong base. In certain embodiments of the present invention, annealing the patterned ohmic contact metal to provide first and second ohmic contacts is carried out prior to forming a protective layer. In other embodiments of the present invention, annealing the patterned ohmic contact metal to provide first and second ohmic contacts is carried out subsequent to forming a protective layer.

DETAILED DESCRIPTION OF EMBODIMENTS OF THE INVENTION

Figure 1A:
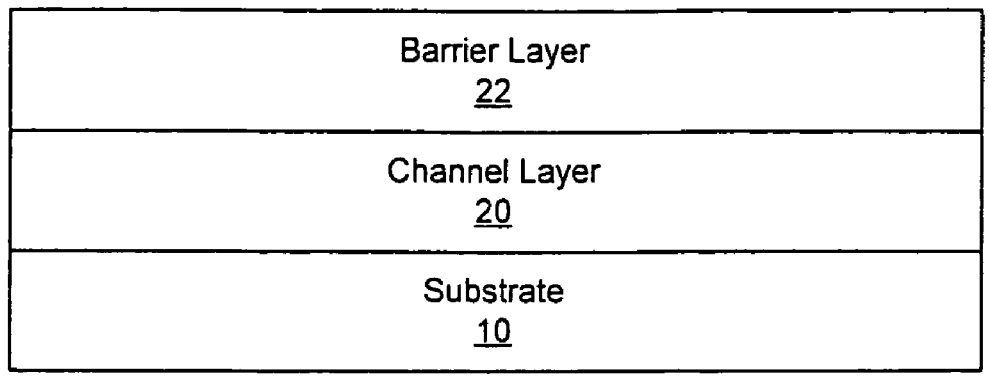
FIGS. 1A-1F are schematic drawings illustrating fabrication of a transistor according to embodiments of the present invention.

The present invention now will be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. Furthermore, the various layers and regions illustrated in the figures are illustrated schematically. Accordingly, the present invention is not limited to the relative size, spacing and alignment illustrated in the accompanying figures. As will also be appreciated by those of skill in the art, references herein to a layer formed "on" a substrate or other layer may refer to the layer formed directly on the substrate or other layer or on an intervening layer or layers formed on the substrate or other layer. It will also be appreciated by those of skill in the art that references to a structure or feature that is disposed "adjacent" another feature may have portions that overlap or underlie the adjacent feature.

Embodiments of the present invention utilize a protective layer and/or a low damage recess fabrication technique to reduce gate leakage and/or provide a high quality Schottky contact in a semiconductor device, such as a transistor. The use of a protective layer may reduce damage to the semiconductor in the gate region of the transistor that may occur during an anneal of ohmic contacts of the device. Thus, high quality gate and ohmic contacts may be provided with reduced degradation of the gate region that may result from formation of the ohmic contacts.

Embodiments of the present invention may be particularly well suited for use in nitride-based HEMTs such as Group III-nitride based devices. As used herein, the term "Group III nitride" refers to those semiconducting compounds formed between nitrogen and the elements in Group III of the periodic table, usually aluminum (Al), gallium (Ga), and/or indium (In). The term also refers to ternary and quaternary compounds such as AlGaN and AlInGaN. As is well understood by those in this art, the Group III elements can combine with nitrogen to form binary (e.g., GaN), ternary (e.g., AlGaN, AlInN), and quaternary (e.g., AlInGaN) compounds. These compounds all have empirical formulas in which one mole of nitrogen is combined with a total of one mole of the Group III elements. Accordingly, formulas such as $Al_xGa_{1-x}N$ where $0 \leq x \leq 1$ are often used to describe them.

Suitable structures for GaN-based HEMTs that may utilize embodiments of the present invention are described, for example, in commonly assigned U.S. Pat. No. 6,316,793 and U.S. Patent Publication No. 2002/0066908A1 filed Jul. 12, 2001 and published Jun. 6, 2002, for "ALUMINUM GALLIUM NITRIDE/GALLIUM NITRIDE HIGH ELECTRON MOBILITY TRANSISTORS HAVING A GATE CONTACT ON A GALLIUM NITRIDE BASED CAP SEGMENT AND METHODS OF FABRICATING SAME," U.S. provisional application Ser. No. 60/290,195 filed May 11, 2001 for "GROUP III NITRIDE BASED HIGH ELECTRON MOBILITY TRANSISTOR (HEMT) WITH BARRIER/SPACER LAYER," United States Patent Publication No. 2002/0167023A1 to Smorchkova et al., published Nov. 14, 2002, entitled "GROUP-III NITRIDE BASED HIGH ELECTRON MOBILITY TRANSISTOR (HEMT) WITH BARRIER/SPACER LAYER" and U.S. patent application Ser. No. 10/617,843 filed Jul. 11, 2003 for "NITRIDE-BASED TRANSISTORS AND METHODS OF FABRICATION THEREOF USING NON-ETCHED CONTACT RECESSES," the disclosures of which are hereby incorporated herein by reference in their entirety.

Fabrication of embodiments of the present invention is schematically illustrated in FIGS. 1A-1E. As seen in FIG. 1A, a substrate 10 is provided on which nitride based devices may be formed. In particular embodiments of the present invention, the substrate 10 may be a semi-insulating silicon carbide (SiC) substrate that may be, for example, 4H polytype of silicon carbide. Other silicon carbide candidate polytypes include the 3C, 6H, and 15R polytypes. The term "semi-insulating" is used descriptively rather than in an absolute sense. In particular embodiments of the present invention, the silicon carbide bulk crystal has a resistivity equal to or higher than about $1 \times 10^5$ Ω-cm at room temperature.

Figure 3:
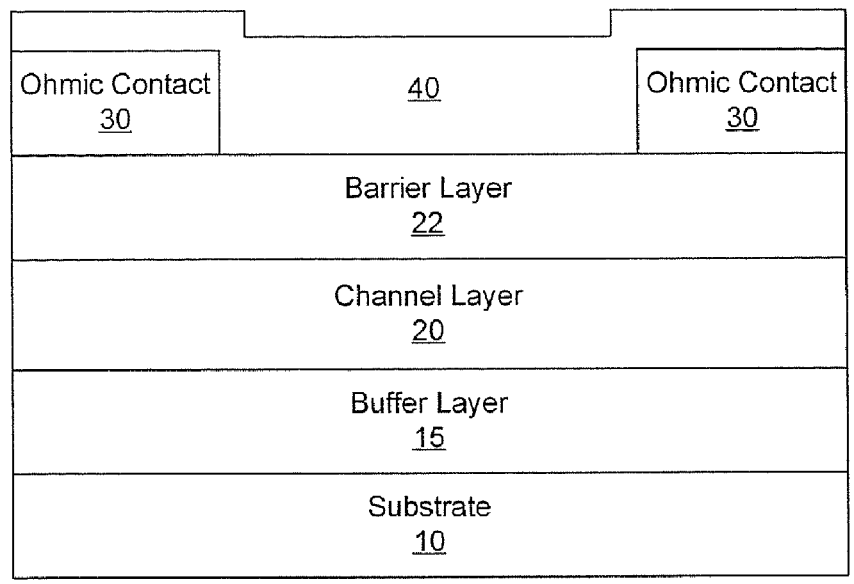
FIG. 3 is a schematic illustration of an alternative fabrication step according to embodiments of the present invention.

Optional buffer 15, nucleation and/or transition layers (not shown) may be provided on the substrate 10 as illustrated, for example, in FIG. 3. For example, an AlN buffer layer may be provided to provide an appropriate crystal structure transition between the silicon carbide substrate and the remainder of the device. Additionally, strain balancing transition layer(s) may also be provided as described, for example, in commonly assigned United States Patent Publication 2003/0102482A1, filed Jul. 19, 2002 and published Jun. 5, 2003, and entitled "STRAIN BALANCED NITRIDE HETROJUNCTION TRANSISTORS AND METHODS OF FABRICATING STRAIN BALANCED NITRIDE HETEROJUNCTION TRANSISTORS," and U.S. Provisional Patent Application Ser. No. 60/337,687, filed Dec. 3, 2001 and entitled "STRAIN BALANCED NITRIDE HETEROJUNCTION TRANSISTOR," the disclosures of which are incorporated herein by reference as if set forth fully herein.

Silicon carbide has a much closer crystal lattice match to Group III nitrides than does sapphire ($Al_2O_3$), which is a very common substrate material for Group III nitride devices. The closer lattice match may result in Group III nitride films of higher quality than those generally available on sapphire. Silicon carbide also has a very high thermal conductivity so that the total output power of Group III nitride devices on silicon carbide is, typically, not as limited by thermal dissipation of the substrate as in the case of the same devices formed on sapphire. Also, the availability of semi-insulating silicon carbide substrates may provide for device isolation and reduced parasitic capacitance. Appropriate SiC substrates are manufactured by, for example, Cree, Inc., of Durham, N.C., the assignee of the present invention, and methods for producing are described, for example, in U.S. Pat. Nos. Re. 34,861; 4,946,547; 5,200,022; and 6,218,680, the contents of which are incorporated herein by reference in their entirety. Similarly, techniques for epitaxial growth of Group III nitrides have been described in, for example, U.S. Pat. Nos. 5,210,051; 5,393,993; 5,523,589; and 5,292,501, the contents of which are also incorporated herein by reference in their entirety.

Although silicon carbide may be used as a substrate material, embodiments of the present invention may utilize any suitable substrate, such as sapphire, aluminum nitride, aluminum gallium nitride, gallium nitride, silicon, GaAs, LGO, ZnO, LAO, InP and the like. In some embodiments, an appropriate buffer layer also may be formed.

Returning to FIG. 1A, a channel layer 20 is provided on the substrate 10. The channel layer 20 may be deposited on the substrate 10 using buffer layers, transition layers, and/or nucleation layers as described above. The channel layer 20 may be under compressive strain. Furthermore, the channel layer and/or buffer nucleation and/or transition layers may be deposited by MOCVD or by other techniques known to those of skill in the art, such as MBE or HVPE.

In some embodiments of the present invention, the channel layer 20 is a Group III-nitride, such as $Al_xGa_{1-x}N$ where $0 \leq x<1$, provided that the energy of the conduction band edge of the channel layer 20 is less than the energy of the conduction band edge of the barrier layer 22 at the interface between the channel and barrier layers. In certain embodiments of the present invention, x=0, indicating that the channel layer 20 is GaN. The channel layer 20 may also be other Group III-nitrides such as InGaN, AlInGaN or the like. The channel layer 20 may be undoped ("unintentionally doped") and may be grown to a thickness of greater than about 20 Å. The channel layer 20 may also be a multi-layer structure, such as a superlattice or combinations of GaN, AlGaN or the like.

A barrier layer 22 is provided on the channel layer 20. The channel layer 20 may have a bandgap that is less than the bandgap of the barrier layer 22 and the channel layer 20 may also have a larger electron affinity than the barrier layer 22. The barrier layer 22 may be deposited on the channel layer 20. In certain embodiments of the present invention, the barrier layer 22 is AlN, AlInN, AlGaN or AlInGaN with a thickness of between about 0.1 nm and about 10 nm. Examples of layers according to certain embodiments of the present invention are described in United States Patent Publication No. 2002/0167023A1, to Smorchkova et al., entitled "GROUP-III NITRIDE BASED HIGH ELECTRON MOBILITY TRANSISTOR (HEMT) WITH BARRIER/SPACER LAYER" the disclosure of which is incorporated herein by reference as if set forth fully herein. In particular embodiments of the present invention, the barrier layer 22 is thick enough and has a high enough Al composition and doping to induce a significant carrier concentration at the interface between the channel layer 20 and the barrier layer 22 through polarization effects when the barrier layer 22 is buried under ohmic contact metal. Also, the barrier layer 22 should be thick enough to reduce or minimize scattering of electrons in the channel due to ionized impurities deposited at the interface between the barrier layer 22 and a second cap layer 24 (FIG. 1B).

The barrier layer 22 may be a Group III-nitride and has a bandgap larger than that of the channel layer 20 and a smaller electron affinity than the channel layer 20. Accordingly, in certain embodiments of the present invention, the barrier layer 22 is AlGaN, AlInGaN and/or AlN or combinations of layers thereof. The barrier layer 22 may, for example, be from about 0.1 nm to about 10 nm thick, but is not so thick as to cause cracking or substantial defect formation therein. In certain embodiments of the present invention, the barrier layer 22 is undoped or doped with an n-type dopant to a concentration less than about $10^{19}$ cm$^{-3}$. In some embodiments of the present invention, the barrier layer 22 is $Al_xGa_{1-x}N$ where $0<x<1$. In particular embodiments, the aluminum concentration is about 25%. However, in other embodiments of the present invention, the barrier layer 22 comprises AlGaN with an aluminum concentration of between about 5% and about 100%. In specific embodiments of the present invention, the aluminum concentration is greater than about 10%.

Figure 1B:
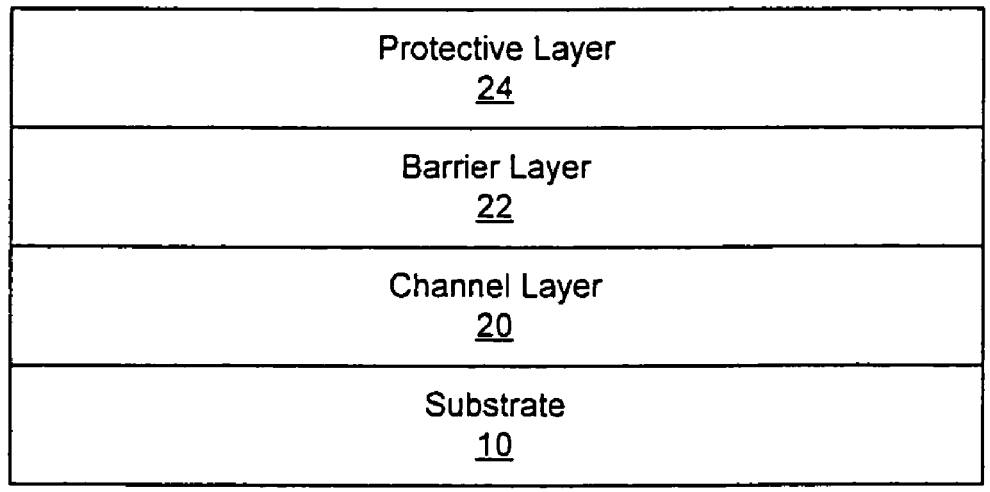

FIG. 1B illustrates formation of a protective layer 24 on the barrier layer 22. The protective layer 24 may be silicon nitride ($Si_xN_y$), aluminum nitride (AlN) and/or other suitable protective material, such as silicon dioxide ($SiO_2$) and/or an oxynitride. Other materials may also be utilized for the protective layer 24 as long as the material may be removed without damaging the underlying barrier layer 22. For example, the protective layer 24 could also include magnesium oxide, scandium oxide, aluminum oxide and/or aluminum oxynitride. Furthermore, the protective layer 24 may be a single layer or multiple layers of uniform and/or non-uniform composition.

In particular embodiments of the present invention, the protective layer 24 is SiN. The SiN may be formed by PVD and/or CVD and may be non-stoichiometric in compressive or tensile strain. For example, the protective layer may have a stress of between about −100 MPa and about 100 MPa. In certain embodiments of the present invention, the SiN protective layer has an index of refraction at a 633 nm wavelength of from about 1.6 to about 2.2. In particular embodiments, the index of refraction of the SiN protective layer is 1.98±0.05.

In certain embodiments, the protective layer 24 may be AlN. The AlN may be formed by PVD and/or CVD and may be non-stoichiometric in compressive or tensile strain. For example, the protective layer may have a stress of between about −100 MPa and about 100 MPa. In certain embodiments of the present invention, the AlN protective layer has an index of refraction at a 633 nm wavelength from about 1.8 to about 2.1. In particular embodiments, the index of refraction of the AlN protective layer is 1.85±0.05.

The protective layer 24 may also be $SiO_2$. The $SiO_2$ may be formed by PVD and/or CVD and may be non-stoichiometric in compressive or tensile strain. For example, the protective layer may have a stress of between about −100 MPa and about 100 MPa. In certain embodiments of the present invention, the $SiO_2$ protective layer has an index of refraction at a 633 nm wavelength of from about 1.36 to about 1.56. In particular embodiments, the index of refraction of the $SiO_2$ protective layer is 1.46±0.03.

The protective layer 24 is blanket formed on the barrier layer 22 and may be formed by deposition. For example, a silicon nitride layer may be formed by high quality sputtering and/or PECVD. Typically, the protective layer 24 may have a thickness of about 30 nm, however, other thickness layers may also be utilized. For example, the protective layer should be sufficiently thick so as to protect the underlying layer during a subsequent anneal of ohmic contacts. Layers as thin as two or three monolayers may be sufficient for such purposes. However, in general, the protective layer 24 may have a thickness of from about 10 nm to about 500 nm. Also, a high quality SiN protective layer may be grown in-situ with the MOCVD growth of the group III nitride layers.

Figure 1C:
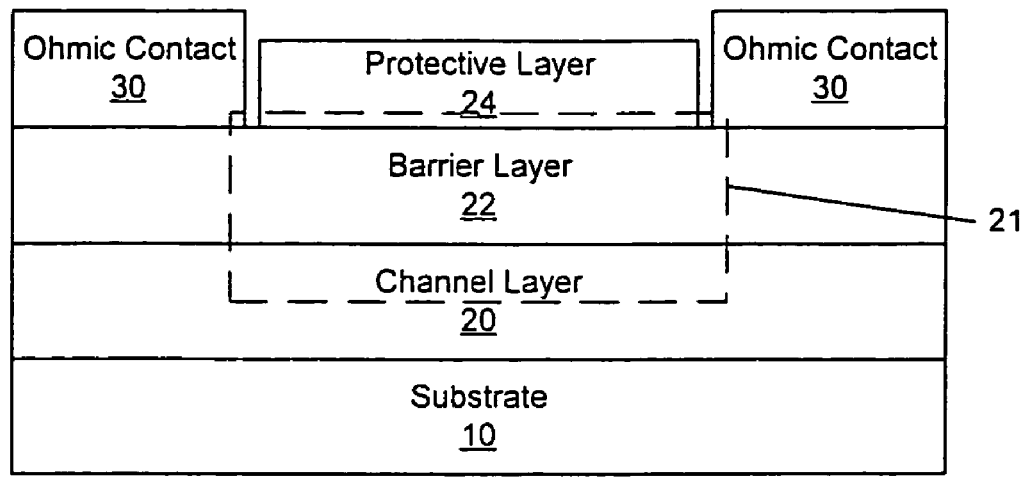

As illustrated in FIG. 1C, windows are opened in the protective layer 24 for formation of ohmic contacts 30. The windows may be formed utilizing a patterned mask and a low damage etch with respect to the barrier layer 22 to expose the underlying barrier layer 22. Examples of low damage etch techniques include etching techniques other than reactive ion etching, such as inductively coupled plasma or electron cyclotron resonance (ECR) or downstream plasma etching with no DC component to the plasma. For $SiO_2$, a low damage etch could be a wet etch with buffered hydrofluoric acid. A selective etch of SiN and/or $SiO_2$ to an etch stop layer, such as ITO, SCO, MgO or the like, followed by a low damage removal of the etch stop layer could also be performed. For SiN, $SiO_2$ may be used as an etch stop layer. In such embodiments, the protective layer 24 may include the SiN, AlN and/or $SiO_2$ layer as well as the etch stop layer. Thus, in certain embodiments of the present invention, the protective layer 24 may include multiple layers.

As is further illustrated in FIG. 1C, with a subsequent photolithography step and evaporation, ohmic metal is patterned to provide the ohmic contacts 30. The ohmic contacts 30 are patterned so as to be smaller than the window in the protective layer 24 such that the edges of the ohmic contacts 30 are spaced apart from the protective layer 24. For example, the edges of the ohmic contacts 30 may be spaced apart from the protective layer 24 by a distance of from about 0.1 to about 0.2 μm. The ohmic contacts 30 should be spaced apart from the protective layer 24 a distance sufficiently large to allow for misalignment tolerances in the formation and patterning of the ohmic contact metal. If the ohmic contact metal contacts the protective layer 24, the metal may diffuse into the protective layer 24 during subsequent heating steps which may result in a short between a gate contact and the ohmic contact (s) 30. However, the gap between the ohmic contacts 30 and the protective layer 24 should not be so large as to defeat the protective purpose of the protective layer 24 and, thereby, substantially degrade the performance of the device but should not be so small to risk random contact of ohmic material to the protective layer. Thus, for example, in certain embodiments of the present invention, the gap may be from about 0.1 μm to about 0.5 μm.

The ohmic contact material is annealed to provide the ohmic contacts 30. The anneal may be a high temperature anneal. For example, the anneal may be an anneal at a temperature of greater than about 900° C. Through the use of an ohmic contact anneal, the resistance of the ohmic contacts may be reduced from a high resistance to less than about 1 Ω-mm. Thus, as used herein, the term "ohmic contact" refers to a non-rectifying contact that has a contact resistance of less than about 1 Ω-mm. The presence of the protective layer during the high temperature process steps may inhibit damage to the barrier layer 22 that may be caused by such steps. Thus, for example, the sheet resistance of the gate region 21 after the high temperature ohmic contact anneal may be substantially the same as the sheet resistance of the gate region 21 as-grown (i.e. before the contact anneal).

Figure 1D:
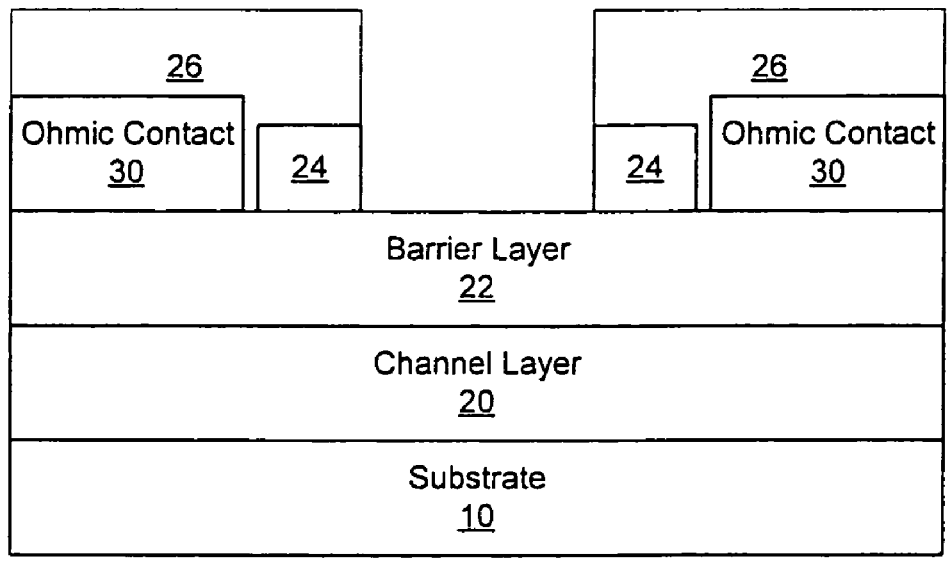

FIG. 1D illustrates the formation of a gate window. As seen in FIG. 1D, a mask 26 is formed on the ohmic contacts and the protective layer 24 and patterned to form a window that exposes a portion of the protective layer 24. A recess is then formed through the protective layer 24 to expose a portion of the barrier layer 22. The recess is formed using the mask 26 and a low damage etch process as described above. In particular embodiments where the ohmic contacts 30 provide source and drain contacts, the recess may be offset between the source and drain contacts such that the recess, and subsequently the gate contact 32, is closer to the source contact than the drain contact.

Figure 1E:
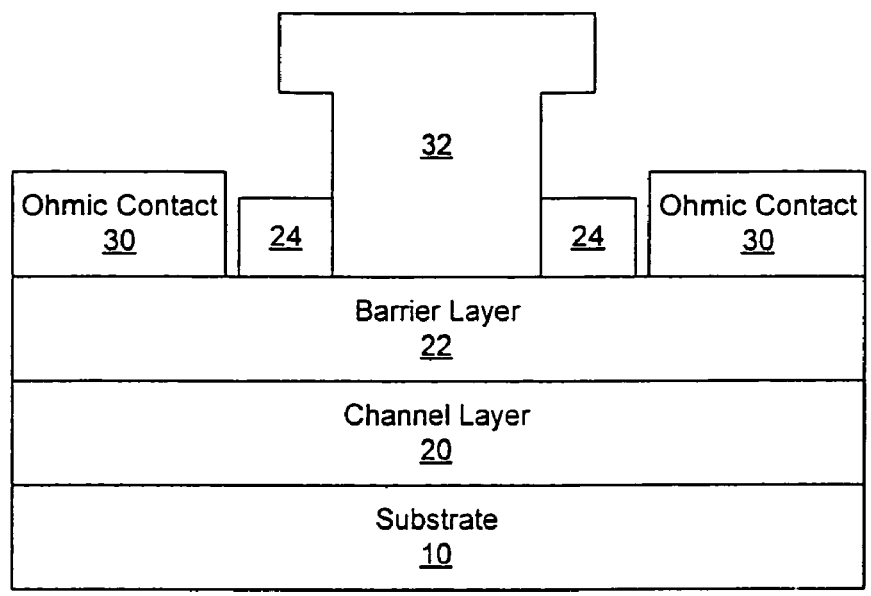

As seen in FIG. 1E, a gate contact 32 is formed in the recess and contacts the exposed portion of the barrier layer 22. The gate contact may be a "T" gate as illustrated in FIG. 1E and may be fabricated using conventional fabrication techniques. Suitable gate materials may depend on the composition of the barrier layer, however, in certain embodiments, conventional materials capable of making a Schottky contact to a nitride based semiconductor material may be used, such as Ni, Pt, $NiSi_x$, Cu, Pd, Cr, W and/or WSiN. Although it may be undesirable, it is possible that a small gap between the protective layer 24 and the gate contact 32 may arise as a result of, for example, anisotropy of the low-damage etch, resulting in an exposed surface of the barrier layer 22 between the protective layer 24 and the gate contact 32.

Figure 1F:
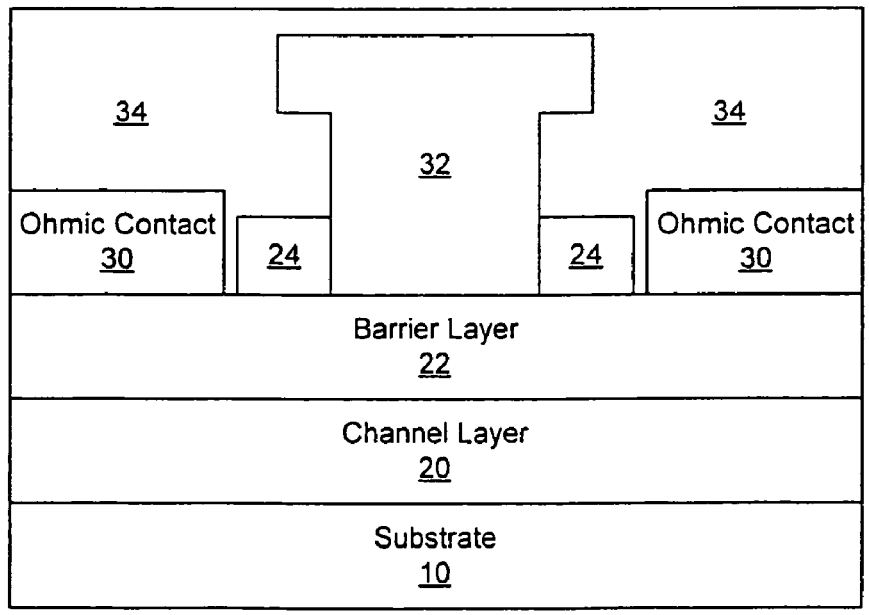

FIG. 1F illustrates the formation of a passivation layer 34. The passivation layer may be blanket deposited on the structure of FIG. 1E. In particular embodiments, the passivation layer 34 is deposited so as to substantially fill the gap between the protective layer 24 and the ohmic contacts 30 and also the gap between the protective layer 24 and the gate contact 32, if such gap exists. In certain embodiments of the present invention, the passivation layer 34 may be silicon nitride, aluminum nitride, silicon dioxide and/or an oxynitride. Furthermore, the passivation layer 34 may be a single or multiple layers of uniform and/or non-uniform composition.

Figure 2A:
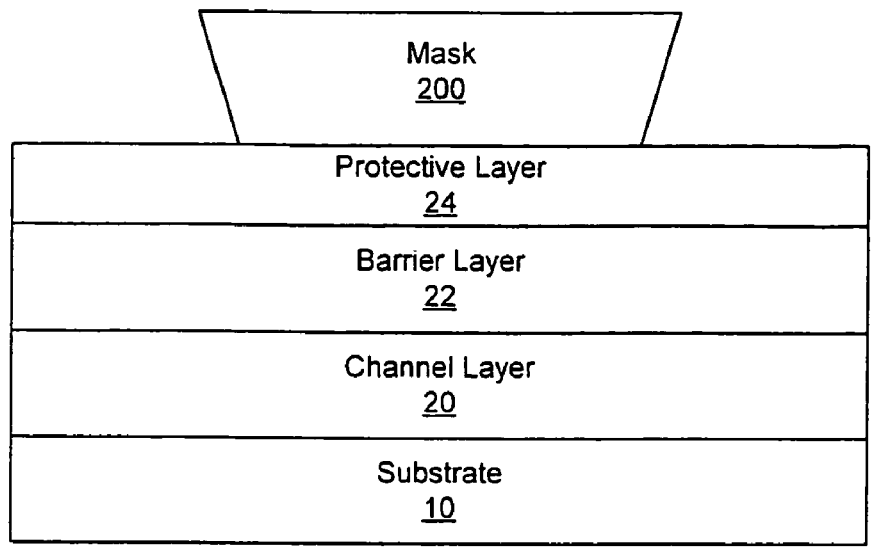
FIGS. 2A and 2B are schematic drawings illustrating operations in the fabrication of a transistor according to further embodiments of the present invention.
Figure 2B:
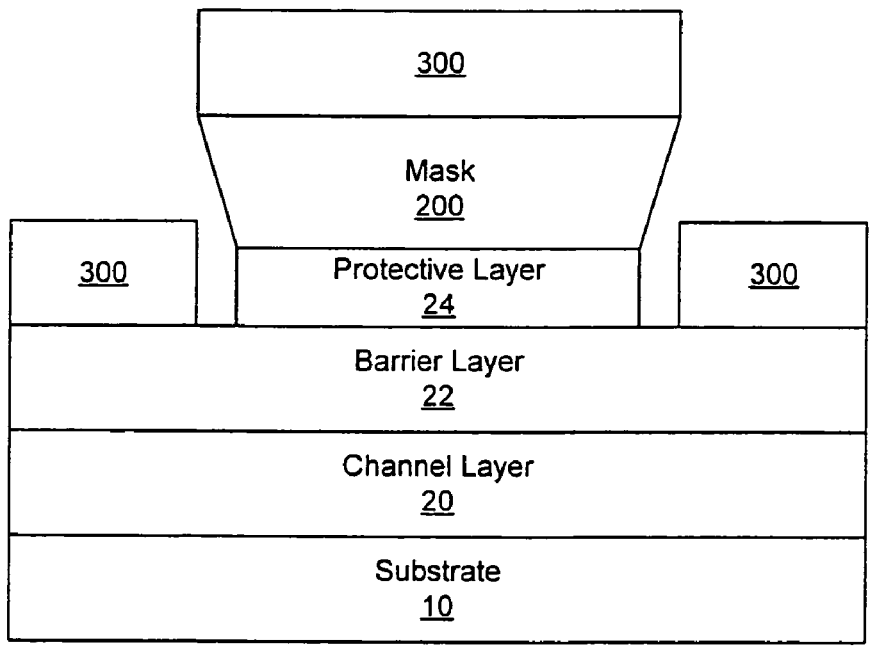

While embodiments of the present invention have been described with reference to a two mask process for forming opening gate contact windows and forming gate contacts with a gap to the protective layer 24, FIGS. 2A and 2B illustrate operations for forming the ohmic contact windows and the ohmic contacts with a single mask. As seen in FIG. 2A, a mask 200, such as a photoresist, with a negative bevel may be formed on the protective layer 24. The negative bevel of the mask 200 corresponds to the gap distance between the subsequently formed ohmic contacts 30 and the patterned protective layer 24. The protective layer 24 is isotropically etched using a low damage etch process as described above to provide the contact windows. Thus, the contact windows will be defined by the bottom dimension of the mask 200. A mask layer without a negative bevel could also be used if the etch is isotropic and the low-damage etch is substantially over etched to provide a lateral undercut to the desired spacing.

As seen in FIG. 2B, ohmic contact metal 300 is evaporated on the resulting structure. The overhang of the mask 200 defines the location where metal is deposited on the exposed barrier layer 22. Thus, the contact metal 300 is spaced apart from the patterned protective layer 24. The mask 200 and the metal 300 on the mask 200 are removed to provide the structure of FIG. 1C.

Techniques for providing a beveled mask as illustrated in FIG. 2A are known to those of skill in the art. Furthermore, while the mask 200 is shown as having a bevel, in other embodiments of the present invention, the mask may have a step or other such configuration that provides a mask with two different apparent window sizes for the etch of the protective layer 24 and the deposition of contact material. Thus, for example, multi-layer photoresists are available that have different exposure sensitivity such that a single exposure may provide a mask with an overhang or step such that the window provided by the layer of photoresist proximate the protective layer 24 is large than a window provided by the layer of photoresist spaced apart from the protective layer 24.

FIG. 3 illustrates fabrication of transistors according to further embodiments of the present invention. As seen in FIG. 3, the formation of the protective layer 24 prior to ohmic metal deposition may be omitted and the ohmic metal may be deposited and patterned on the barrier layer 22 to provide ohmic contact material regions 30 on the barrier layer 22. A protective layer 40 is then formed on the gate region of the barrier layer 22 and the ohmic contact material. In particular embodiments of the present invention, the protective layer 40 may be aluminum nitride that is blanket deposited by sputtering. The protective layer 40 may also be materials such as described above with reference to the protective layer 24.

The anneal of the ohmic contact material regions 30 is carried out with the protective layer 40 in place. The protective layer 40 may then be removed, for example, using a low damage etching technique such as those described above. The gate contact 32 may then be formed, before or after formation of a passivation layer 34. For example, a layer of silicon nitride could be deposited by sputtering. A gate recess could then be etched, for example, using a low damage etch process as described above, into the passivation layer and the gate formed in the recess. Such a process may provide for the silicon nitride passivation layer maintaining its full thickness to the edge of the "T" gate. Thus, a transistor having a structure such as that illustrated in FIG. 4 may be provided.

Figure 4:
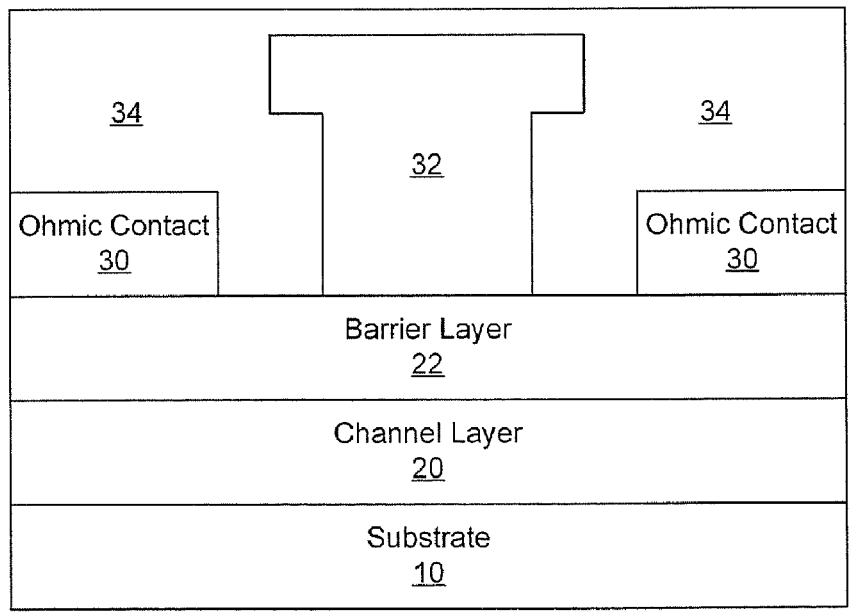
FIG. 4 is a schematic illustration of a transistor according to further embodiments of the present invention.

Alternatively, the structure illustrated in FIG. 4 may be provided utilizing the fabrication steps illustrated in FIGS. 1A-1F, however, the protective layer 24 may be removed either prior to or subsequent to the formation of the gate contact 32. In such a case, the protective layer 24 should be removed using low damage etching techniques such as those described above.

Figure 5:
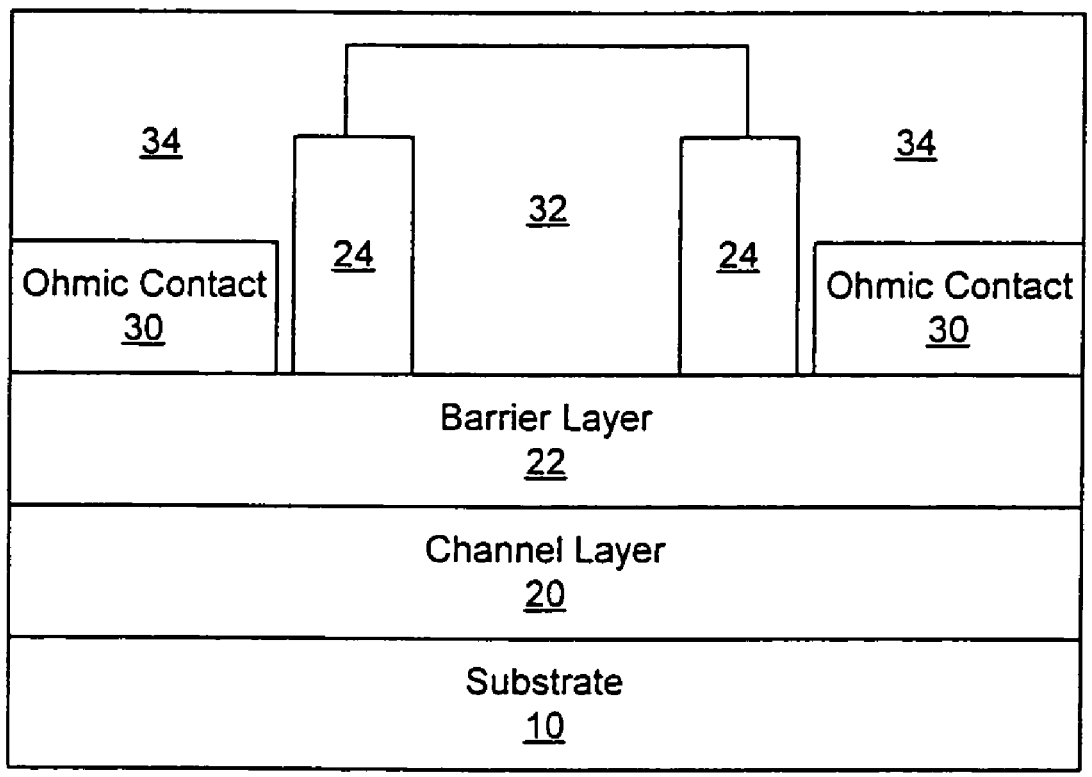
FIG. 5 is a schematic illustration of a transistor according to further embodiments of the present invention.

FIG. 5 illustrates further embodiments of the present invention where the protective layer 24 is formed to at least about as thick as the ohmic contacts 30. As seen in FIG. 5, in such embodiments, the wings of the gate contact 34 may be formed directly on the protective layer 24. For example, the protective layer 24 may be formed to a thickness of from about 500 to about 5000 Å. A low damage etch through the protective layer 24 would be carried out and the "T" gate 32 formed directly on and through the protective layer 24. Subsequent overlayer passivation 34 may also be provided, for example, to improve environmental protection of the device.

While embodiments of the present invention have been described herein with reference to particular HEMT structures, the present invention should not be construed as limited to such structures. For example, additional layers may be included in the HEMT device while still benefiting from the teachings of the present invention. Such additional layers may include GaN cap layers, as for example, described in Yu et al., "Schottky barrier engineering in III-V nitrides via the piezoelectric effect," Applied Physics Letters, Vol. 73, No. 13, 1998, or in U.S. Patent Publication No. 2002/0066908A1 filed Jul. 12, 2001 and published Jun. 6, 2002, for "ALUMINUM GALLIUM NITRIDE/GALLIUM NITRIDE HIGH ELECTRON MOBILITY TRANSISTORS HAVING A GATE CONTACT ON A GALLIUM NITRIDE BASED CAP SEGMENT AND METHODS OF FABRICATING SAME," the disclosures of which are incorporated herein by reference as if set forth fully herein. In some embodiments, insulating layers such as SiNx, or relatively high quality AlN may be deposited for making a MISHEMT and/or passivating the surface. The additional layers may also include a compositionally graded transition layer or layers.

Furthermore, the barrier layer 22 may also be provided with multiple layers as described in United States Patent Publication No. 2002/0167023A1, to Smorchkova et al., entitled "GROUP-III NITRIDE BASED HIGH ELECTRON MOBILITY TRANSISTOR (HEMT) WITH BARRIER/SPACER LAYER" the disclosure of which is incorporated herein by reference as if set forth fully herein. Thus, embodiments of the present invention should not be construed as limiting the barrier layer to a single layer but may include, for example, barrier layers having combinations of GaN, AlGaN and/or AlN layers. For example, a GaN, AlN structure may be utilized to reduce or prevent alloy scattering. Thus, embodiments of the present invention may include nitride based barrier layers, such nitride based barrier layers may include AlGaN based barrier layers, AlN based barrier layers and combinations thereof.

In the drawings and specification, there have been disclosed typical embodiments of the invention, and, although specific terms have been employed, they have been used in a generic and descriptive sense only and not for purposes of limitation.

That which is claimed is:

1. A high electron mobility transistor comprising:
a nitride-based channel layer on a substrate;
a nitride-based semiconductor barrier layer on the nitride-based channel layer, the nitride based semiconductor barrier layer having a sheet resistance after a high temperature anneal that is substantially the same as a sheet resistance of the nitride-based semiconductor barrier layer before the high temperature anneal;
ohmic contacts on the barrier layer;
a gate contact on the barrier layer;
a protective layer disposed on the barrier layer that is adjacent and spaced apart from the ohmic contacts and that the gate contact extends through;
a passivation layer on the protective layer and that substantially fills a gap between the ohmic contacts and the protective layer.

2. The high electron mobility transistor of claim 1, wherein the passivation layer is also on the protective layer and wherein the gate contact extends through the protective layer and the passivation layer.

3. The high electron mobility transistor of claim 1, wherein at least a portion of the gate contact is directly on the protective layer and a portion of the gate contact is directly on the barrier layer.

4. The high electron mobility transistor of claim 1, further comprising a passivation layer on the barrier layer that substantially fills a gap between the ohmic contacts and the gate contact.

5. The high electron mobility transistor of claim 1:
wherein the nitride-based channel layer comprises a Group III-nitride layer; and
wherein the nitride-based semiconductor barrier layer comprises a Group III-nitride layer.

6. The high electron mobility transistor of claim 1, wherein the channel layer has a lower bandgap than the barrier layer.

7. The high electron mobility transistor of claim 1, wherein the channel layer comprises an undoped layer having a thickness of greater than about 20 Å.

8. The high electron mobility transistor of claim 1, wherein the channel layer comprises a superlattice and/or a combination of Group III-nitride layers.

9. The high electron mobility transistor of claim 1:
wherein the channel layer comprises aluminum gallium nitride (AlGaN), gallium nitride (GaN), indium gallium nitride (InGaN), and/or aluminum indium gallium nitride (AlInGaN); and
wherein the barrier layer comprises aluminum nitride (AlN), aluminum indium nitride (AlInN), AlGaN, GaN, InGaN, and/or AlInGaN.

10. The high electron mobility transistor of claim 1, wherein the barrier layer comprises $Al_xGa_{1-x}N$ wherein $0<x<1$.

11. The high electron mobility transistor of claim 1, wherein the barrier layer comprises multiple layers.

12. The high electron mobility transistor of claim 1, further comprising a buffer layer on the substrate, and wherein the nitride-based channel layer is disposed on the buffer layer.

13. The high electron mobility transistor of claim 1, wherein the protective layer has a thickness at least as thick as the ohmic contacts.

14. The high electron mobility transistor of claim 1, wherein the ohmic contacts have a contact resistance of less than about 1 Ω-mm.

15. A high electron mobility transistor, comprising:
a nitride-based channel layer on a substrate;
a nitride-based semiconductor barrier layer on the nitride-based channel layer;
a protective layer on the barrier layer;
ohmic contacts on the barrier layer, adjacent and spaced apart from the protective layer so as to provide a gap between the ohmic contacts and the protective layer;
a gate contact on the barrier layer and extending through the protective layer; and
a passivation layer on the protective layer and that substantially fills the gap between the ohmic contacts and the protective layer.

16. The high electron mobility transistor of claim 15:
wherein the nitride-based channel layer comprises a Group III-nitride layer; and
wherein the nitride-based semiconductor barrier layer comprises a Group III-nitride layer.

17. The high electron mobility transistor of claim 15, wherein the channel layer has a lower bandgap than the barrier layer.

18. The high electron mobility transistor of claim 15, wherein the channel layer comprises an undoped layer having a thickness of greater than about 20 Å.

19. The high electron mobility transistor of claim 15, wherein the channel layer comprises a superlattice and/or a combination of Group III-nitride layers.

20. The high electron mobility transistor of claim 17:
wherein the channel layer comprises aluminum gallium nitride (AlGaN), gallium nitride (GaN), indium gallium nitride (InGaN), and/or aluminum indium gallium nitride (AlInGaN); and
wherein the barrier layer comprises aluminum nitride (AlN), aluminum indium nitride (AlInN), AlGaN, GaN, InGaN, and/or AlInGaN.

21. The high electron mobility transistor of claim 15, wherein the barrier layer comprises $Al_xGa_{1-x}N$ wherein $0<x<1$.

22. The high electron mobility transistor of claim 15, wherein the barrier layer comprises multiple layers.

23. The high electron mobility transistor of claim 15, further comprising a buffer layer on the substrate, and wherein the nitride-based channel layer is disposed on the buffer layer.

24. The high electron mobility transistor of claim 15, wherein the protective layer is at least as thick as the ohmic contacts.

25. The high electron mobility transistor of claim 15, wherein the gate contact is directly on the protective layer.

26. The high electron mobility transistor of claim 15, wherein the protective layer has at thickness of about two monolayers.

27. The high electron mobility transistor of claim 1, wherein the high temperature anneal is performed at a temperature of greater than about 900° C.

28. The high electron mobility transistor of claim 1, wherein the high temperature anneal is an ohmic contact anneal that reduces the resistance of the ohmic contacts from a high resistance to less than about 1 Ω-mm.

* * * * *